US009964294B2

(12) United States Patent
Osborne et al.

(10) Patent No.: US 9,964,294 B2
(45) Date of Patent: May 8, 2018

(54) DISPLAY SCREEN ASSEMBLY

(71) Applicant: Samsung Pay, Inc., Burlington, MA (US)

(72) Inventors: John Osborne, Incline Village, NV (US); David W Russell, Winter Garden, FL (US)

(73) Assignee: Samsung Pay, Inc., Burlington, MA (US)

( * ) Notice: Subject to any disclaimer, the term of this patent is extended or adjusted under 35 U.S.C. 154(b) by 0 days. days.

(21) Appl. No.: 13/838,076

(22) Filed: Mar. 15, 2013

(65) Prior Publication Data

US 2013/0258715 A1    Oct. 3, 2013

Related U.S. Application Data

(60) Provisional application No. 61/619,608, filed on Apr. 3, 2012.

(51) Int. Cl.
*F21V 23/00* (2015.01)
*H05K 1/18* (2006.01)

(52) U.S. Cl.
CPC ........... *F21V 23/005* (2013.01); *H05K 1/189* (2013.01); *H05K 2201/10106* (2013.01); *H05K 2201/10128* (2013.01); *H05K 2201/10522* (2013.01)

(58) Field of Classification Search
CPC .... F21V 23/005; G02F 1/133; G02F 1/13306; G02F 1/1336; G02F 1/133603; G02F 1/133615; G02F 1/133308; G02F 1/13452; G02F 1/1345; G02F 1/13454; H05K 1/189; H05K 2201/10106; H05K 2201/10128; H05K 2201/10522; H05K 1/147; H05K 1/141; H05K 1/0274; H05K 1/118; H05K 2201/10136; H05K 2201/10189; G02B 6/006
(Continued)

(56) References Cited

U.S. PATENT DOCUMENTS 6,613,599 B2 * 9/2003 Imaeda ........................... 438/30
6,676,284 B1 * 1/2004 Wynne Willson ............ 362/555
(Continued)

OTHER PUBLICATIONS

Osborne, John et al. Display Screen Assembly, U.S. Appl. No. 61/619,608, filed Apr. 3, 2012. 156 pages.

*Primary Examiner* — Anh Mai
*Assistant Examiner* — Arman B Fallahkhair
(74) *Attorney, Agent, or Firm* — Seyfarth Shaw LLP; Brian Michaelis

(57) ABSTRACT

A display screen assembly is suitable for use in a digital device that lacks the processing power, memory, or both needed to carry out light-simulated bar code processing. The display screen assembly includes a display screen having a display area and mounted to a flexible circuit. The flexible circuit includes numerous conductive circuit traces including terminal ends, and various electronic components such as a controller and a screen driver. The various components may be covered by a cover layer, and the display screen including the display area may be covered by a sheet of transparent material. An LED may be generally positioned near an edge or corner of the display screen, and may be may be controlled by a digital device processor or by the controller on the flexible circuit, as desired, for producing light-simulated bar codes.

32 Claims, 6 Drawing Sheets

(58) Field of Classification Search
USPC ............. 362/612, 249.02, 249.04, 613, 631, 362/600–607; 349/65; 235/435, 454, 235/455, 462.01, 462.41, 462.42, 487
See application file for complete search history.

(56) References Cited

U.S. PATENT DOCUMENTS

| | | | | |
|---|---|---|---|---|
| 6,685,093 | B2* | 2/2004 | Challa | G06K 7/1095 235/462.46 |
| 6,736,322 | B2 | 5/2004 | Gobburu et al. | |
| 6,877,665 | B2 | 4/2005 | Challa et al. | |
| 7,028,906 | B2 | 4/2006 | Challa et al. | |
| 7,144,257 | B2* | 12/2006 | Yumoto et al. | 439/67 |
| 7,290,712 | B2* | 11/2007 | Leoniak | G06K 7/1095 235/462.01 |
| 7,395,961 | B2 | 7/2008 | Challa et al. | |
| 7,580,103 | B2* | 8/2009 | Kawaguchi | 349/150 |
| 7,857,225 | B2 | 12/2010 | Challa et al. | |
| 7,874,683 | B2* | 1/2011 | Noba | H04N 5/74 353/119 |
| 7,916,237 | B2* | 3/2011 | Jung et al. | 349/58 |
| 7,953,462 | B2* | 5/2011 | Harry | G06Q 30/02 345/173 |
| 7,967,211 | B2 | 6/2011 | Challa et al. | |
| 8,063,497 | B2* | 11/2011 | Tang et al. | 257/786 |
| 8,072,765 | B2* | 12/2011 | Yumoto et al. | 361/749 |
| 8,154,679 | B2* | 4/2012 | Kim | 349/58 |
| 8,666,456 | B2* | 3/2014 | Liu | H04M 1/72519 345/173 |
| 8,794,529 | B2* | 8/2014 | Osborne et al. | 235/487 |
| 8,894,242 | B2* | 11/2014 | Tada | H04M 1/18 362/267 |
| 9,282,657 | B2* | 3/2016 | Miyaoka | H05K 5/0217 |
| 2002/0074404 | A1* | 6/2002 | Drumm | G06K 7/1095 235/462.01 |
| 2007/0290965 | A1* | 12/2007 | Shiraishi | 345/87 |
| 2010/0275259 | A1* | 10/2010 | Adams et al. | 726/19 |

* cited by examiner

DISPLAY SCREEN ASSEMBLY

CROSS-REFERENCE TO RELATED APPLICATIONS

This application claims the benefit of U.S. Provisional Patent Application Ser. No. 61/619,608 filed Apr. 3, 2012, which hereby is incorporated herein in its entirety by reference thereto.

BACKGROUND OF THE INVENTION

Field of the Invention

This invention relates generally to a display screen for a digital device, and more particularly to a display screen assembly for a digital device.

Description of the Related Art

In the manufacture of many different types of digital devices with display screens, pre-manufactured display screen assemblies are used to reduce the cost of manufacture. Many such devices also have various components such as switches, buttons, audio jacks, and light emitting diodes ("LED"), which are also installed into the digital device during manufacture.

SUMMARY OF THE INVENTION

One embodiment of the present invention is a display screen assembly comprising: a flexible circuit; a display screen physically mounted to the flexible circuit; a LED disposed in proximity to the display screen and electrically coupled to the flexible circuit; a LED controller physically mounted to the flexible circuit, the flexible circuit having traces for electrically coupling the LED controller to the LED; and a screen driver physically mounted to the flexible circuit, the flexible circuit having traces for electrically coupling the screen driver to the display screen; wherein the flexible circuit comprises terminal ends for connection to external circuitry, and traces for electrically coupling the screen driver and the LED controller to the terminal ends.

Another embodiment of the present invention is a display screen assembly comprising: a flexible circuit; a display screen physically mounted to the flexible circuit; a LED physically mounted to the display screen and having leads electrically coupled to the flexible circuit; a LED controller physically mounted to the flexible circuit, the flexible circuit having traces for electrically coupling the LED controller to the leads of the LED; and a screen driver physically mounted to the flexible circuit, the flexible circuit having traces for electrically coupling the screen driver to the display screen; wherein the flexible circuit comprises terminal ends for connection to external circuitry, and traces for electrically coupling the screen driver and the LED controller to the terminal ends.

DETAILED DESCRIPTION OF THE INVENTION, INCLUDING THE BEST MODE

Figure 1:
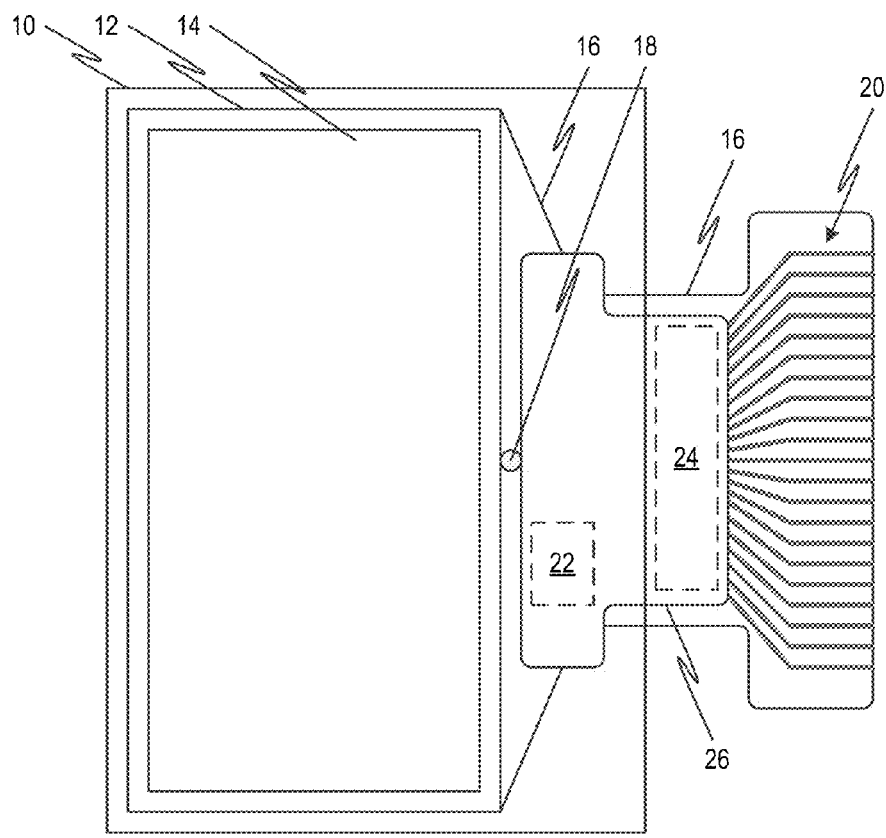
FIG. 1 is a top plan view of a display screen assembly.

The display screens of digital devices may be used for many purposes. One such use is for communicating information to a bar code scanner with variations in light that simulate a reflection of a scanning beam being moved across a static visual image of the bar code, which may be referred to as "light-simulated bar code." The light-simulated bar code technology as well as the various types of digital devices suitable for using light-simulated bar codes are described in, for example, U.S. Pat. No. 6,877,665 issued Apr. 12, 2005 to Challa et al., U.S. Pat. No. 6,685,093 issued Feb. 3, 2004 to Challa et al., U.S. Pat. No. 6,736,322 issued May 18, 2004 to Gobburu et al., U.S. Pat. No. 7,028,906 issued Apr. 18, 2006 to Challa et al., U.S. Pat. No. 7,395,961 issued Jul. 8, 2008 to Challa et al., U.S. Pat. No. 7,857,225 issued Dec. 28, 2010 to Challa et al., and U.S. Pat. No. 7,967,211 issued Jun. 28, 2011 to Challa et al., all of which hereby are incorporated herein in their entirety by reference thereto. The light may be varied in any desired way, including by varying brightness or by turning the light output on and off, by varying color, or in other ways. The term "light" is a broad term as used herein, and includes infrared light as well as visible light.

Various types of light sources, including those in use in pixel based display devices, may be used for light-simulated bar codes. Liquid crystal displays ("LCD") which utilize a backlight for screen brightness may, for example, be very effective for producing light-simulated bar codes because the entire backlight may be modulated to provide the desired light/dark sequence. Even displays which have no backlight, for example but not limited to OLED, LED, electroluminescent, and plasma displays, may be used for light-simulated bar codes. Other light sources mounted in the digital device may also suitable for producing light-simulated bar codes, including, for example, a discrete LED of the type sometimes used for notification and to indicate charging status, and a discrete LED associated with a camera which may be built into the digital device. A disadvantage of including one or more discrete LED's in a digital device is the increased cost of manufacture, especially the additional assembly steps needed for mounting the LED's in the digital device.

Suitable digital devices vary greatly in their processing power and memory. Some may lack the processing power, memory, or both needed to carry out light-simulated bar code processing without adversely affecting device performance, and may even be unable to carry out light-simulated bar code processing at all. While increasing the processing power and memory of the digital device itself is an option, it may not be a practical or cost-effective option in some cases.

Digital devices may include a processor and a computer-readable medium in any suitable combination of hardware, firmware and software. Examples of processors include microprocessors, controllers and logic circuits, and a processor may be implemented as a multi-core unit or by multiple processor units. Examples of computer readable media, which may be realized in a single type of read-only memory or readable-writable memory or which may include combinations of different types of memory, include static random access memory ("SRAM"), dynamic random access memory ("DRAM"), FLASH memory, solid-state memory, magnetic memory, optical memory, compact disk read-only memory, and so forth. Data and programs containing processor-executable instructions for operating the mobile personal digital device and implementing various applications may be stored in the computer-readable medium and executed by the processor.

Figure 2:
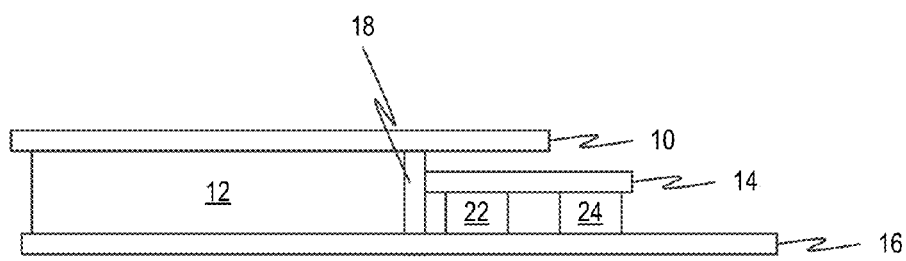
FIG. 2 is a side plan view of the display screen assembly of FIG. 1.

FIG. 1 is a top plan view of a display screen assembly which may be used in a digital device that lacks the processing power, memory, or both needed to carry out light-simulated bar code processing. FIG. 2 is a side plan view of the display assembly of FIG. 1. The display screen assembly of FIG. 1 includes a display screen 12 of any desired type, which has a display area 14. The display screen 12 is mounted to a flexible circuit 16 of any desired type, such as, for example, a polyimide film, which includes numerous conductive circuit traces including terminal ends 20 for connection to external circuitry, and various electronic components illustratively represented by a controller 22 and a screen driver 24. Screen driver 24 may be a single component or multiple components, and along with other associated components (not shown) are well known in the art. The various components including the controller 22 and the screen driver 24 may be covered by a cover layer 26, which may be any desired type of material such as, for example, an adhesive backed flexible film, or a flexible cover film applied as a liquid and dried. The display screen 12 including the display area 14 is covered by a sheet of transparent material 10. Any desired sheet of material may be used, including protective material such as, for example, transparent polyester film and glass. The sheet 10 may be touch-sensitive if desired, using any suitable technology such as resistive or capacitive.

FIG. 1 also shows an LED 18 which is generally positioned near an edge or corner of the display screen 12. The LED 18 may be may be controlled by a digital device processor or by the controller 22, as desired, for producing light-simulated bar codes.

Figure 3:
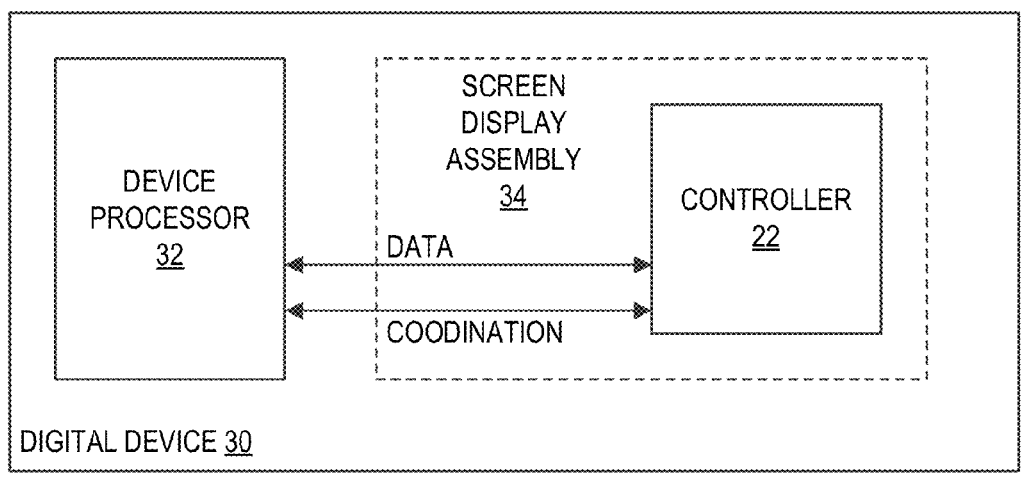
FIG. 3 is a schematic block diagram of a digital device which includes a screen display assembly.

The controller 22 is provided for handling part or all of the light-simulated bar code processing, in lieu of processing by the processing and memory circuits and software of the digital device. FIG. 3 is a schematic diagram showing a digital device 30 which has a device processor 32. The controller 22 is mounted in a screen display assembly 34, and is in communication with the device processor 32 in any suitable manner, illustratively via data signals and various coordination signals such as interrupts, status signals and messaging, commands, and so forth. Controller 22 illustratively is of a type having both processing circuitry and data memory circuitry, although data memory may be omitted if sufficient memory is available elsewhere in the display screen assembly or in the digital device. Light-simulated bar code processing may be carried out primarily by the controller 22 in cooperation with with the digital device processor 32, or even with an processor or computer systems external to the digital device if the digital device has network access. The amount of control by the controller 22 and amount of controller by the digital device processor 32 and any external processor or computer system may be established as desired. Many different network technologies are satisfactory, including, for example, wired or wireless protocols such as but not limited to I2C, SMB, SPI, RS232, UART, bit parallel, zigbee, Bluetooth, NFC, and so forth.

In a first illustrative implementation, the processing capability of the controller 22 may be used in conjunction with the processor of the digital device such that the communications and control overhead of the digital device processor 32 for light-simulated bar code processing is not significantly increased and possibly even reduced. For example but without limitation, the processor of the digital device may send a simple numeric bit encoded transmission representing the decoded barcode to the controller 22, which generates the requisite timing and light/dark sequence internally within the display screen assembly.

Figure 4:
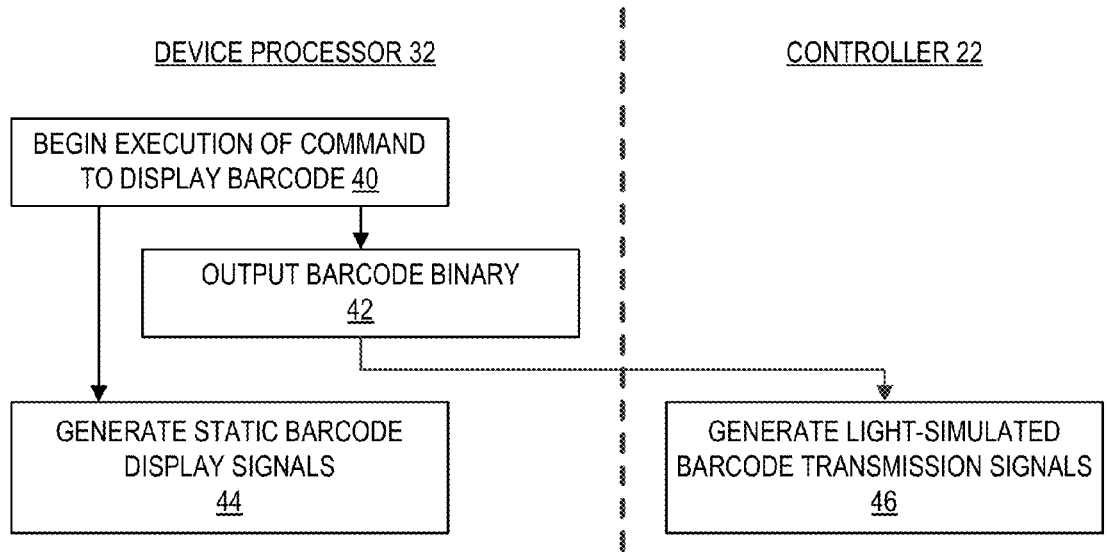
FIG. 4 is a flowchart of a process for generating light-simulated barcodes using a controller on a display screen assembly.

FIG. 4 is a flowchart of an illustrative computer-implemented process for carrying out the first implementation. The device processor 32 receives and begins execution of a command to display a barcode (block 40). During the course of execution, the device processor 32 outputs a bar code binary value, which is communicated to the controller 22 (block 42). The controller 22 receives the output barcode binary and generates light-simulated bar code transmission signals for controlling the operation of either the display screen 12, the LED 18, or both (block 46). Meanwhile, the device processor 32 generates static barcode display signals (block 44).

Figure 5:
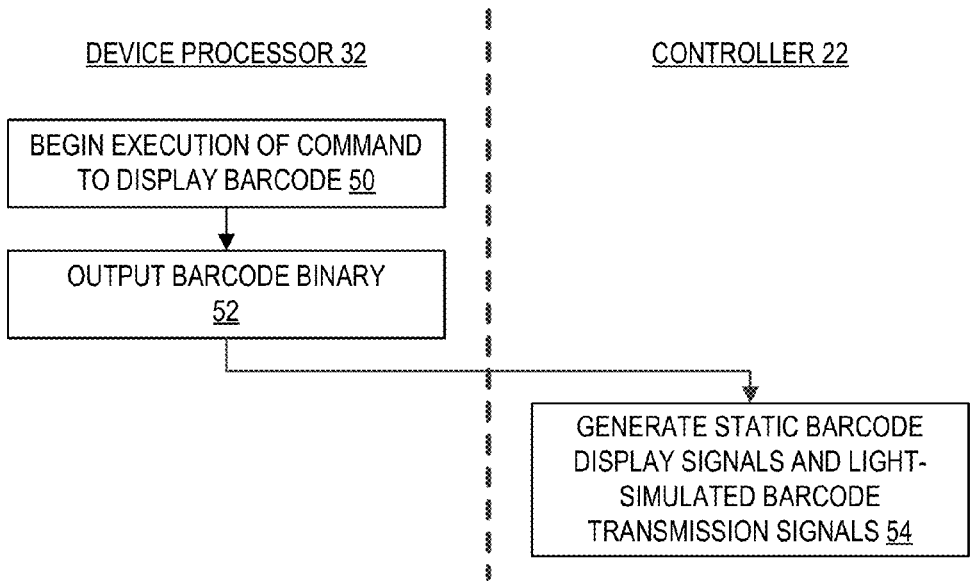
FIG. 5 is a flowchart of another process for generating light-simulated barcodes using a controller on a display screen assembly.

FIG. 5 is a flowchart of an alternative computer-implemented process for carrying out the first implementation, and in which the controller 22 offloads work conventionally performed by the device processor 32, which may then focus its processing power on other tasks. The device processor 32 receives and begins execution of a command to display a barcode (block 50). During the course of execution, the device processor 32 outputs a bar code binary value, which is communicated to the controller 22 (block 52). The controller 22 receives the output barcode binary, and generates control signals both for the static barcode display, and for the light-simulated bar code transmission (block 54). The light-simulated bar codes may be transmitted from either the display screen 12, the LED 18, or both.

In a second illustrative implementation, the digital device processor 32 may cause a static barcode image to be displayed on the screen using pixel display commands, while the controller 22 detects the pixel display signals and generates the requisite timing and light/dark sequence internally within the display screen assembly.

Figure 6:
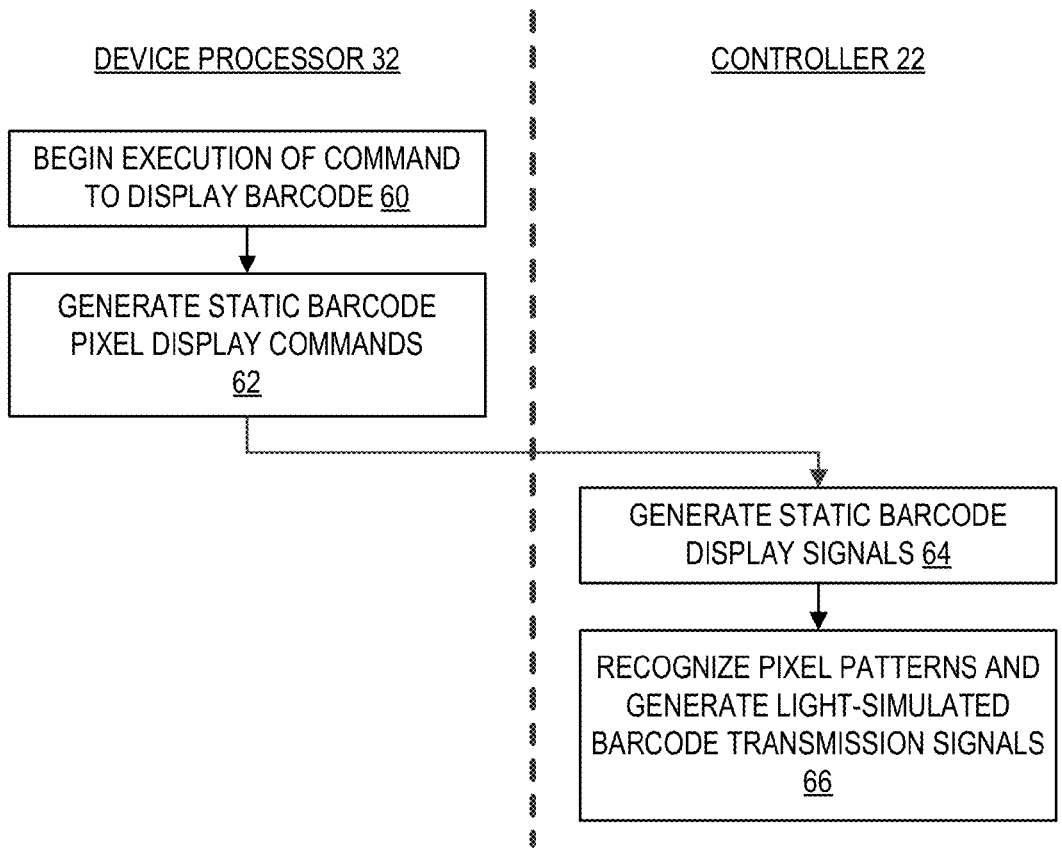
FIG. 6 is a flowchart of another process for generating light-simulated barcodes using a controller on a display screen assembly.

FIG. 6 is a flowchart of an illustrative computer-implemented process for carrying out the second implementation. The device processor 32 receives and begins execution of a command to display a barcode (block 60). During the course of execution, the device processor 32 generates pixel display commands for the static barcode (62). These commands are provided to the controller 22, which generates static barcode display signals (block 64). The controller 22 also functions to recognize pixel patterns and to generated light-simulated bar code transmission signals (block 66). The light-simulated bar codes may be transmitted from either the display screen 12, the LED 18, or both.

In a third illustrative implementation, a 2-Dimensional barcode or other encoded image may be converted into a light/dark sequence of transmissions capable of delivering the same binary content to the 1-Dimensional scanning reader. This encoding may be performed by the device processor 32 or by the controller 22, which may be provided access to the Internet or other database capability via the digital device so that the 2-D barcode information may be used as an index to retrieve standardized 1-D barcode. The standardized 1-D barcode may then be processed by the device processor 32 and/or the controller 22 using other techniques described herein to generate the static bar code and/or the requisite timing and light/dark sequence.

Figure 7:
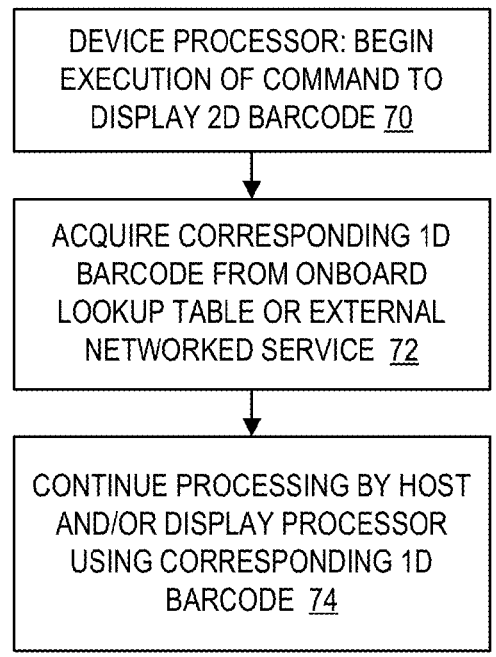
FIG. 7 is a flowchart of another process for generating light-simulated barcodes using a controller on a display screen assembly.

FIG. 7 is a flowchart of an illustrative computer-implemented process for carrying out the third implementation. The device processor 32 receives and begins execution of a command to display a 2-D barcode (block 70). During the course of execution, either the device processor 32 or the controller 22 in cooperation with the device processor 32 acquires a 1-D barcode that corresponds to the 2-D barcode (block 72). The corresponding 1-D barcode may be acquired in many different ways, including, for example, from an onboard lookup table or from an external service or processor accessed over a network. Processing may then proceed to transmit the 1-D bar code as a light-simulated bar code using any of the techniques described herein.

Many different types of LED's are suitable for use as the LED 18 (FIGS. 1 and 2). Discrete LED's such as, for example, thru hole white and multi-colored LED's, surface mounted LED's, LED modules, and LED arrays are all suitable for producing light-simulated bar codes. Such LED's may be built into the display screen assembly, thereby making the LED's available at lower cost for incorporation into digital devices.

Figure 8:
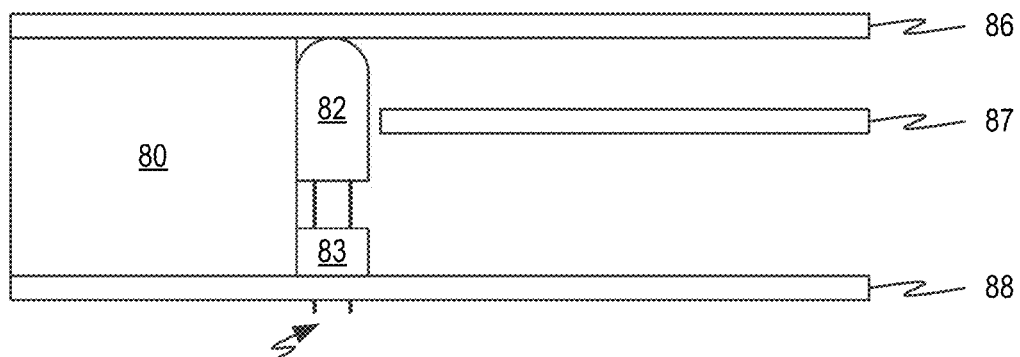
FIG. 8 is a side plan view of a LED component mounted in a display screen assembly.

FIG. 8 shows a thru hole LED 82, which may be mounted against the side of a display screen 80 in a variety of different ways, such as, for example, with adhesive, epoxy, a retainer clip, or in any other suitable manner. The LED 82 may be positioned under a transparent layer 86 and spaced-away from a cover layer 87 which protects various electronic components (not shown) mounted on a flexible circuit 88. Depending on where the flexible circuit 88 is designed to flex and on the degree of flexibility, a stiffener 83 may be used if desired to prevent the flexible circuit 88 from flexing near the intersection with the display screen 80 and breaking or pulling out one or more leads 84 of the LED 82. Suitable stiffeners include an elongated block of insulating material glued to the display screen 80 and the flexible circuit 88 along their intersection, a thick bead of epoxy deposited along the intersection of the display screen 80 and the flexible circuit 88, and so forth.

In a variation (not shown), the leads 84 of the thru hole LED 82 may be made of a stiff electrically conductive material that is not easily bent, and may be affixed by solder or in any other suitable manner either directly to the flexible circuit 88 or through a base member such as the stiffener 83. The LED 82 may be positioned under the transparent layer 86 and next to the display screen 80, but spaced away from the transparent layer 86 and the display screen 80, as well as spaced-away from the cover layer 87 which protects various electronic components (not shown). In this variation, the LED 82 is fully supported by the leads 84.

Figure 9:
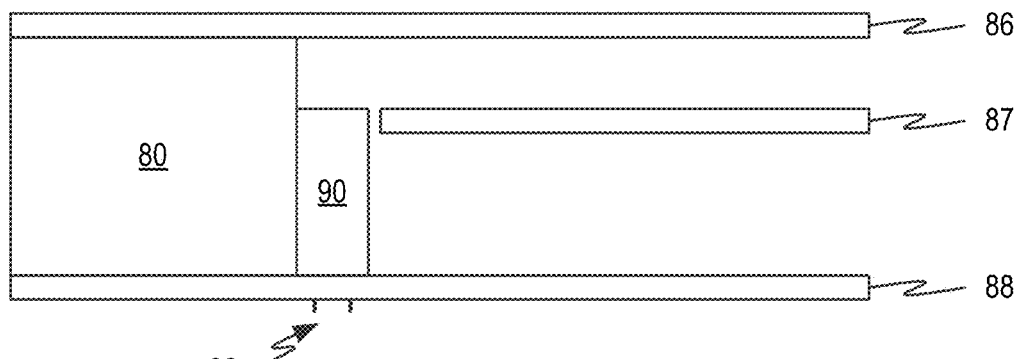
FIG. 9 is a side plan view of a LED module mounted in a display screen assembly.

FIG. 9 shows a LED module 90, which illustrative may have several LED's mounted in a heat sink. A lens may be incorporated into the LED module 90 if desired to focus the light. The LED module 90 may be mounted against the side of the display screen 80 in a variety of different ways, and is also mounted to the flexible circuit 88. Depending on the flexibility of the flexible circuit 88, a stiffener (not shown) may be used if desired to prevent the flexible circuit 88 from flexing near the display screen 80 and breaking or pulling out one or more leads 92 of the LED module 90.

Figure 10:
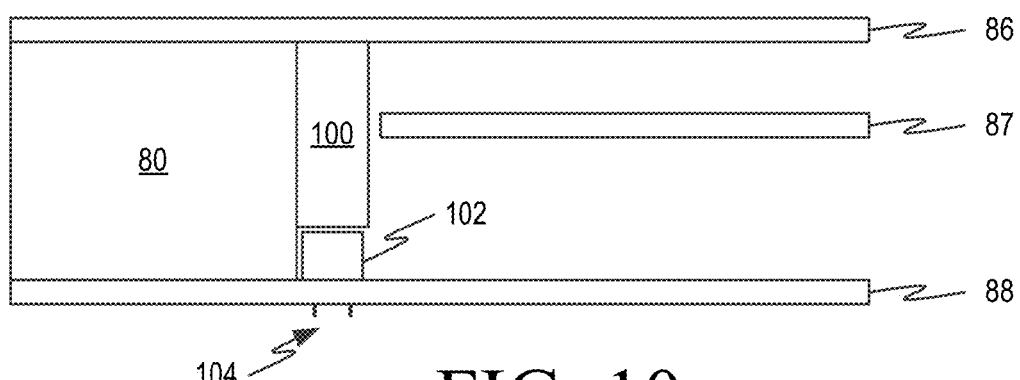
FIG. 10 is a side plan view of a surface mounted LED and light guide mounted in a display screen assembly.

FIG. 10 shows a surface mounted LED 102. A light guide 100 is mounted against the side of the display screen 80 and functions to conduct light from the LED 102 to the transparent sheet 86. Many different types of light guides are well known in the art. The LED 102 is mounted to the flexible circuit 88 but illustratively is free of the side of the display screen 80. The flexible circuit 88 may therefore be flexed without stressing the leads 104, even while light still couples into the light guide 100.

Figure 11:
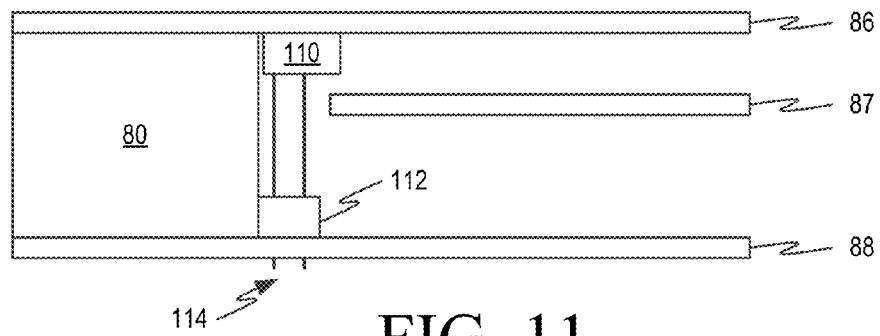
FIG. 11 is a side plan view of a LED array mounted in a display screen assembly.

FIG. 11 shows a LED array 110, which illustrative may have several LED's arranged in one or more rows parallel to the side of the display screen 80. The LED array 110 may be mounted against the underside of the transparent sheet 86 in any of a variety of different ways. Depending on the flexibility of the flexible circuit 88, a stiffener 112 may be used if desired to prevent the flexible circuit 88 from flexing near the display screen 80 and breaking or pulling out one or more leads 114 of the LED array 110.

The mounting techniques described with reference to FIGS. 8-11 are not exclusive to the type of LED, and each technique may be used to mount various types of LED's.

Figure 12:
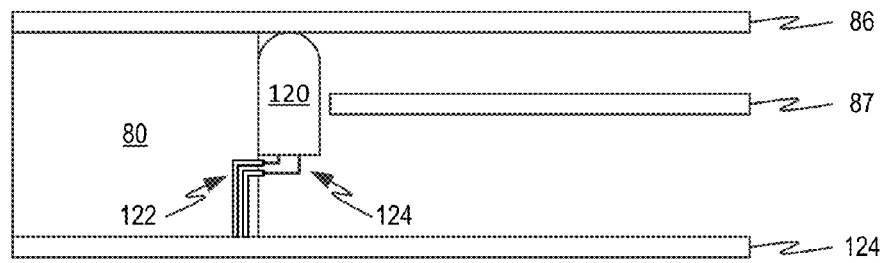
FIG. 12 is a side plan view of a LED component mounted in a display screen assembly.

In some types of screen display assemblies, the area of the flexible circuit 16 adjacent the display screen 12 (FIG. 1) may be entirely occupied by a high density of traces from the screen driver 24 to the electrical grid of the display screen 12. In these display screen assemblies, the high density of driver traces in this area may preclude the routing through this area of separate traces for a discrete LED. In these types of display screen assemblies, some of the driver traces may be used in lieu of dedicated traces to control the discrete LED. In another approach, extra traces for the LED may be added at the outside edge of the flexible circuit 124 and extended along the edge of the display screen 12 parallel to the edge of the flexible circuit 124. Such traces would allow the leads from a LED mounted at the corner or on the parallel edge of the display screen 12 to be connected to the extra traces away from areas of the flexible circuit 88 subject to flexing. Alternatively, the LED may be mounted anywhere along the side of display screen 12 by providing connecting traces on the side of the display screen 12 to connect the leads of the LED to the traces on the flexible circuit 88 away from areas of the flexible circuit 88 subject to flexing. An example is shown in FIG. 12, in which traces 122 along an outside edge of the display screen 12 are used to connect the leads 124 of LED 120 illustratively located in the position shown in FIG. 1 to traces (not shown) near the long edge of the flexible circuit 88.

Figure 13:
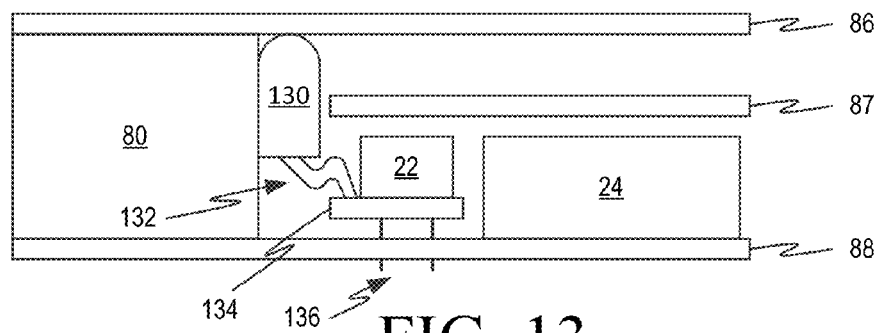
FIG. 13 is a side plan view of a LED component mounted in a display screen assembly using a retrofit approach.

Existing production may be retrofitted. An example of an illustrative retrofit approach is shown in FIG. 13, in which an auxiliary circuit 134, which may or may not be flexible, may be attach to the flexible circuit 88 in the connector area, which may be referred to as a main flexible circuit. The controller 22 may be mounted on the auxiliary circuit 134, and flexible leads 132 from LED 130 may be connected to the auxiliary circuit 134. The auxiliary circuit 134 may be electrically connected using leads such as 136, which may be flexible leads if desired, to existing traces on the main flexible circuit 88, or a minor modification may be made to flexible circuit 88 to add traces to accommodate the minimal number of connective leads 136 from the auxiliary circuit 134.

In a variation of FIG. 13, the various implementations described herein with respect to FIG. 8 through FIG. 12 may be made using an auxiliary circuit such as the auxiliary circuit 134.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Unless otherwise explicitly stated, any specific values given herein are illustrative, and may be varied as desired. Where various timings are set forth, these timings may not be exact unless otherwise explicitly stated, but rather may vary depending on circuit layout, signal line impedance, and other practical design factors as are well known in the art. A reference to individual values indicative of a range is inclusive of all values within the range. These and other variations and modifications of the embodiments disclosed herein, including of the alternatives and equivalents of the various elements of the embodiments, may be made without departing from the scope of the invention.

The invention claimed is:

1. A display screen assembly comprising:
   a flexible circuit;
   a display screen directly mounted to the flexible circuit, wherein the display screen comprises a display area on a surface of the display screen;
   a discreet LED disposed in proximity to the display screen and electrically coupled to the flexible circuit, the LED being positioned so that the illumination of the LED does not fall on the display area, wherein the LED is directly mounted to the display screen;
   a LED controller directly mounted to the flexible circuit, the flexible circuit having traces for electrically coupling the LED controller to the LED, the LED controller controlling the LED to generate light-simulated bar codes; and
   a screen driver directly mounted to the flexible circuit, the flexible circuit having traces for electrically coupling the screen driver to the display screen;
   wherein the flexible circuit comprises terminal ends for connection to external circuitry, and traces for electrically coupling the screen driver and the LED controller to the terminal ends.

2. The display screen assembly of claim 1 wherein:
   the LED comprises electrically-conductive leads; and
   the LED is directly mounted to the flexible circuit, and electrically coupled to the flexible circuit by the leads.

3. The display screen assembly of claim 2 further comprising:
   a light guide directly mounted to the display screen;
   wherein the LED is positioned proximate to an end of the light guide for coupling light into the light guide.

4. The display screen assembly of claim 1 wherein:
   the flexible circuit comprises an auxiliary circuit attached thereto;
   the LED comprises electrically-conductive leads; and
   the LED is electrically coupled to the auxiliary circuit by the leads.

5. The display screen assembly of claim 4 further comprising:
   a transparent sheet disposed over the display screen and covering the display area thereof;
   wherein the LED is directly mounted to the transparent sheet.

6. The display screen assembly of claim 1 wherein:
   the LED comprises electrically-conductive leads; and
   the LED is electrically coupled to the flexible circuit by the leads.

7. The display screen assembly of claim 1 wherein:
   the LED comprises stiff electrically-conductive leads; and
   the LED is directly and electrically mounted to the flexible circuit by the leads.

8. The display screen assembly of claim 1 wherein:
   the LED comprises electrically-conductive leads; and
   the LED is directly mounted to the display screen and to the flexible circuit, and electrically coupled to the flexible circuit by the leads.

9. The display screen assembly of claim 1 further comprising:
   a transparent sheet disposed over the display screen and covering the display area thereof;
   wherein the LED comprises electrically-conductive leads; and
   wherein the LED is directly mounted to the transparent sheet, and electrically coupled to the flexible circuit by the leads.

10. The display screen assembly of claim 1 further comprising:
    supplemental electrical traces disposed on the display screen and extending to the flexible circuit;
    wherein the LED comprises electrically-conductive leads; and
    the LED is electrically coupled to the supplemental electrical traces by the leads.

11. The display screen assembly of claim 1 wherein the LED controller controls the LED to transmit light-simulated bar codes.

12. The display screen assembly of claim 1 wherein the display screen receives static bar code display signals.

13. The display screen assembly of claim 1 wherein the display screen assembly is configured to transmit light-simulated bar codes from the display screen, the LED, or both.

14. The display screen assembly of claim 1 wherein light emitted from the LED does not fall on the display area.

15. A display screen assembly comprising:
    a flexible circuit;
    a display screen directly mounted to the flexible circuit, wherein the display screen comprises a display area on a surface of the display screen;
    a discreet LED directly mounted to the display screen and having leads electrically coupled to the flexible circuit, the LED being positioned so that the illumination of the LED does not fall on the display area;
    a LED controller directly mounted to the flexible circuit, the flexible circuit having traces for electrically coupling the LED controller to the leads of the LED; and
    a screen driver directly mounted to the flexible circuit, the flexible circuit having traces for electrically coupling the screen driver to the display screen;
    wherein the flexible circuit comprises terminal ends for connection to external circuitry, and traces for electrically coupling the screen driver and the LED controller to the terminal ends.

16. The display screen assembly of claim 15 wherein the LED controller controls the LED to transmit light-simulated bar codes.

17. The display screen assembly of claim 16 wherein the display screen receives static bar code display signals.

18. The display screen assembly of claim 15, wherein the flexible circuit comprises a main portion and an auxiliary portion,
- the LED controller being directly mounted to the auxiliary portion,
- the leads from the LED being electrically coupled to the auxiliary portion,
- the screen driver being directly mounted to the main portion, and
- the auxiliary portion being directly mounted to the main portion and having leads for electrically coupling the auxiliary portion to the main portion.

19. The display screen assembly of claim 15 wherein the display screen assembly is configured to transmit light-simulated bar codes from the display screen, the LED, or both.

20. The display screen assembly of claim 15 wherein light emitted from the LED does not fall on the display area.

21. A display screen assembly comprising:
- a flexible circuit;
- a display screen directly mounted to the flexible circuit, wherein the display screen comprises a display area on a surface of the display screen;
- a discreet LED disposed near an edge or corner of the display screen, wherein the LED is directly mounted to the display screen the illumination of the LED does not fall on the illumination area and wherein the LED is electrically coupled to the flexible circuit;
- a LED controller directly mounted to the flexible circuit, the flexible circuit having traces for electrically coupling the LED controller to the LED, the LED controller controlling the LED to generate light-simulated bar codes; and
- a screen driver directly mounted to the flexible circuit, the flexible circuit having traces for electrically coupling the screen driver to the display screen;
- wherein the flexible circuit comprises terminal ends for connection to external circuitry, and traces for electrically coupling the screen driver and the LED controller to the terminal ends.

22. The display screen assembly of claim 21 wherein:
- the LED comprises electrically-conductive leads; and
- the LED is directly mounted to the flexible circuit, and electrically coupled to the flexible circuit by the leads.

23. The display screen assembly of claim 22 further comprising:
- a light guide directly mounted to the display screen;
- wherein the LED is positioned proximate to an end of the light guide for coupling light into the light guide.

24. The display screen assembly of claim 21 wherein the LED controller controls the LED to transmit light-simulated bar codes.

25. The display screen assembly of claim 24 wherein the display screen receives static bar code display signals.

26. The display screen assembly of claim 21 wherein:
- the LED comprises stiff electrically-conductive leads; and
- the LED is directly and electrically mounted to the flexible circuit by the leads.

27. The display screen assembly of claim 21 wherein:
- the LED comprises electrically-conductive leads; and
- the LED is directly mounted to the display screen and to the flexible circuit, and electrically coupled to the flexible circuit by the leads.

28. The display screen assembly of claim 21 further comprising:
- supplemental electrical traces disposed on the display screen and extending to the flexible circuit;
- wherein the LED comprises electrically-conductive leads; and
- the LED is directly mounted to the display screen, and electrically coupled to the supplemental electrical traces by the leads.

29. The display screen assembly of claim 21 wherein the display screen assembly is configured to transmit light-simulated bar codes from the display screen, the LED, or both.

30. A display screen assembly comprising:
- a flexible circuit;
- a display screen physically mounted to the flexible circuit, wherein the display screen comprises a display area on a surface of the display screen;
- a discreet LED disposed near an edge or corner of the display screen, and wherein the LED is directly mounted to the display screen the illumination of the LED does not fall on the illumination area and wherein the LED is electrically coupled to the flexible circuit;
- a LED controller physically mounted to the flexible circuit, the flexible circuit having traces for electrically coupling the LED controller to the LED, the LED controller controlling the LED to generate light-simulated bar codes;
- a screen driver physically mounted to the flexible circuit, the flexible circuit having traces for electrically coupling the screen driver to the display screen; and
- a transparent layer covering the display area, wherein the LED is disposed under the transparent layer and light from the LED is conducted to the transparent layer, wherein:
- the LED comprises electrically-conductive leads; and
- the LED is physically mounted to the display screen, and electrically coupled to the flexible circuit by the leads, and
- wherein the flexible circuit comprises terminal ends for connection to external circuitry, and traces for electrically coupling the screen driver and the LED controller to the terminal ends.

31. A display screen assembly of claim 30 wherein the LED comprises electrically-conductive leads and wherein the LED is physically mounted to the transparent sheet, and electrically coupled to the flexible circuit by the leads.

32. A display screen assembly comprising:
- a flexible circuit;
- a display screen physically mounted to the flexible circuit, wherein the display screen comprises a display area on a surface of the display screen;
- a discreet LED directly mounted to the display screen and having leads electrically coupled to the flexible circuit, the LED being positioned so that the illumination of the LED does not fall on the display area;
- a LED controller physically mounted to the flexible circuit, the flexible circuit having traces for electrically coupling the LED controller to the leads of the LED; the LED controller controlling the LED to generate light-simulated bar codes;
- a screen driver physically mounted to the flexible circuit, the flexible circuit having traces for electrically coupling the screen driver to the display screen; and
- a transparent layer covering the display area of the display screen, and the display screen assembly is configured such that light from the LED is conducted to the transparent layer, wherein the flexible circuit comprises terminal ends for connection to external circuitry, and traces for electrically coupling the screen driver and the LED controller to the terminal ends.

* * * * *